United States Patent
Kotani et al.

(10) Patent No.: US 9,831,310 B2
(45) Date of Patent: Nov. 28, 2017

(54) COMPOUND SEMICONDUCTOR DEVICE, METHOD FOR PRODUCING THE SAME, POWER-SUPPLY UNIT, AND HIGH-FREQUENCY AMPLIFIER

(71) Applicant: FUJITSU LIMITED, Kawasaki-shi, Kanagawa (JP)

(72) Inventors: Junji Kotani, Isehara (JP); Norikazu Nakamura, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/900,617

(22) Filed: May 23, 2013

(65) Prior Publication Data

US 2014/0015608 A1    Jan. 16, 2014

(30) Foreign Application Priority Data

Jul. 10, 2012   (JP) ................. 2012-155083

(51) Int. Cl.
*H01L 21/02*  (2006.01)
*H01L 29/20*  (2006.01)
(Continued)

(52) U.S. Cl.
CPC ...... *H01L 29/2003* (2013.01); *H01L 21/0254* (2013.01); *H01L 21/0262* (2013.01); *H01L 21/02458* (2013.01); *H01L 21/02505* (2013.01); *H01L 21/02579* (2013.01); *H01L 29/1075* (2013.01); *H01L 29/36* (2013.01); *H01L 29/66462* (2013.01); *H01L 29/7787* (2013.01); *H02M 3/335* (2013.01); *H03F 1/3247* (2013.01); *H03F 3/16* (2013.01); *H02M 3/28* (2013.01)

(58) Field of Classification Search
CPC ................ H01L 21/02304; H01L 21/02436
USPC ........................................ 257/190
See application file for complete search history.

(56) References Cited

U.S. PATENT DOCUMENTS 7,485,512 B2 *  2/2009  Harris et al. .................. 438/167
8,212,288 B2 *  7/2012  Komiyama et al. .......... 257/190
(Continued)

FOREIGN PATENT DOCUMENTS

CN      102386221 A    3/2012
CN      103367421 A    10/2013
(Continued)

OTHER PUBLICATIONS

Poblenz et al., "Effect of carbon doping on buffer leakage in AlGaN/GaN high electron mobility transistors", Journal of Vacuum Science and Technology B 22 (2004) pp. 1145-1149.*

(Continued)

*Primary Examiner* — Jay C Kim
(74) *Attorney, Agent, or Firm* — Kratz, Quintos & Hanson, LLP (57) ABSTRACT

A compound semiconductor device includes: a compound semiconductor multilayer structure including a first buffer layer composed of AlN; and a second buffer layer composed of AlGaN and formed above the first buffer layer, wherein the second buffer layer contains carbon, and wherein the concentration of carbon in the second buffer layer increases with increasing distance from a lower surface of the second buffer layer toward an upper surface of the second buffer layer.

11 Claims, 9 Drawing Sheets

(51) Int. Cl.
| | |
|---|---|
| *H03F 3/16* | (2006.01) |
| *H02M 3/335* | (2006.01) |
| *H01L 29/36* | (2006.01) |
| *H01L 29/66* | (2006.01) |
| *H01L 29/778* | (2006.01) |
| *H01L 29/10* | (2006.01) |
| *H03F 1/32* | (2006.01) |
| *H02M 3/28* | (2006.01) |

(56) References Cited

U.S. PATENT DOCUMENTS

| | | | |
|---|---|---|---|
| 8,450,782 B2* | 5/2013 | Sato | H01L 29/7787 257/288 |
| 2006/0281238 A1 | 12/2006 | Harris et al. | |
| 2010/0244101 A1 | 9/2010 | Kokawa | |
| 2011/0001127 A1* | 1/2011 | Sakamoto | H01L 21/02381 257/22 |
| 2011/0062556 A1 | 3/2011 | Komiyama et al. | |
| 2011/0073911 A1* | 3/2011 | Sato | H01L 29/107 257/194 |
| 2012/0025202 A1* | 2/2012 | Makabe | H01L 21/02381 257/76 |
| 2012/0025205 A1 | 2/2012 | Nakata et al. | |
| 2012/0049180 A1 | 3/2012 | Yamada | |
| 2012/0119219 A1* | 5/2012 | Takado et al. | 257/76 |
| 2013/0020581 A1* | 1/2013 | Teraguchi | H01L 21/02381 257/76 |
| 2013/0240901 A1* | 9/2013 | Kohda et al. | 257/76 |
| 2013/0248872 A1 | 9/2013 | Nakamura et al. | |
| 2014/0239308 A1* | 8/2014 | Hallin | H01L 21/02458 257/76 |

FOREIGN PATENT DOCUMENTS

| | | | | |
|---|---|---|---|---|
| JP | 2007-251144 A1 | 9/2007 | | |
| JP | 2010-239034 A1 | 10/2010 | | |
| JP | 2011-082494 A | 4/2011 | | |
| JP | 2012-9630 A1 | 1/2012 | | |
| JP | 2012-015306 A | 1/2012 | | |
| JP | 2012-033575 A | 2/2012 | | |
| JP | 2012-033703 A | 2/2012 | | |
| JP | WO 2012/066701 | * | 5/2012 | H01L 21/338 |

OTHER PUBLICATIONS

Kaun et al., "Molecular beam epitaxy for high-performance Ga-face GaN electron devices", Semiconductor Science and Technology 28 (2013) 074001.*

Selvaraj et al., "Effect of GaN Buffer Layer Growth Pressure on the Device Characteristics of AlGaN/GaN High-Electron-Mobility Transistors on Si", Japanese Journal of Applied Physics 48 (2009) 121002.*

Office Action of corresponding Japanese Patent Application No. 2012-155083 dated Jan. 19, 2016 with Partial Translation.

Office Action of corresponding Chinese Patent Application No. 201310209732.7 dated Sep. 14, 2015 with full translation.

Taiwanese Office Action dated Oct. 24, 2016 of corresponding Taiwanese Patent Application No. 102120078, with translation.

Office Action of corresponding Japanese Patent Application No. 2012-155083 dated Jun. 7, 2016, with partial translation.

Japanese Patent Application No. 2016-174655: Notifications of Reasons for Refusal dated May 23, 2017.

* cited by examiner

FIG. 9

COMPOUND SEMICONDUCTOR DEVICE, METHOD FOR PRODUCING THE SAME, POWER-SUPPLY UNIT, AND HIGH-FREQUENCY AMPLIFIER

CROSS-REFERENCE TO RELATED APPLICATIONS

This application is based upon and claims the benefit of priority of the prior Japanese Patent Application No. 2012-155083, filed on Jul. 10, 2012, the entire contents of which are incorporated herein by reference.

FIELD

The embodiments discussed herein are related to a compound semiconductor device, a method for producing the compound semiconductor device, a power-supply unit, and a high-frequency amplifier.

BACKGROUND

Nitride semiconductors have properties, such as high saturation electron velocity and wide band gaps. Thus, attempts have been made to use nitride semiconductors for high-power semiconductor devices with high-breakdown voltages. For example, GaN, which is a nitride semiconductor, has a band gap of 3.4 eV, which is larger than the band gap of Si (1.1 eV) and the band gap of GaAs (1.4 eV). Hence, GaN has a high breakdown field strength. Accordingly, GaN is a highly promising material for high-power semiconductor devices, which operate at high voltages, used in power supplies.

Many reports have been made of field-effect transistors, in particular, high electron mobility transistors (HEMTs) as semiconductor devices composed of nitride semiconductors. For example, with respect to GaN-based HEMTs (GaN-HEMTs), AlGaN/GaN HEMTs including electron transit layers composed of GaN and electron supply layers composed of AlGaN have been receiving attention. In an AlGaN/GaN HEMT, a difference in lattice constant between GaN and AlGaN causes strain in AlGaN. The strain-induced piezoelectric polarization and the spontaneous polarization of AlGaN results in a high-density two-dimensional electron gas (2DEG). Thus, AlGaN/GaN HEMTs are promising high-breakdown voltage devices usable for, for example, high-efficiency switch elements and electric vehicles.

Japanese Laid-open Patent Publication Nos. 2012-9630, 2010-239034, and 2007-251144 are reference documents cited in this specification.

To produce a high-quality nitride semiconductor device at low cost, for example, a nitride semiconductor layer may be formed on a common Si substrate by an epitaxial growth method.

However, Si and a nitride semiconductor differ significantly from each other not only in lattice constant but also in thermal expansion coefficient. Thus, in order to grow a high-quality nitride semiconductor layer, an appropriately designed buffer layer is used.

To resolve the lattice mismatch and the difference in thermal expansion coefficient between Si and the nitride semiconductor as much as possible, the buffer layer is formed so as to have a relatively large thickness.

As a result, in the case where a HEMT including a nitride semiconductor multilayer structure containing the buffer layer is fabricated, there is a problem in which a leakage current (off-leakage current) passes through the buffer layer or a lower layer region of an electron transit layer. In this case, it is difficult to control the residual carrier concentration, so that it is very difficult to inhibit the occurrence of the off-leakage current, thereby leading to a reduction in breakdown voltage.

SUMMARY

According to an aspect of the invention, a compound semiconductor device includes: a compound semiconductor multilayer structure including a first buffer layer composed of AlN; and a second buffer layer composed of AlGaN and formed above the first buffer layer, wherein the second buffer layer contains carbon, and wherein the concentration of carbon in the second buffer layer increases with increasing distance from a lower surface of the second buffer layer toward an upper surface of the second buffer layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

In this embodiment, an AlGaN/GaN HEMT composed of a nitride semiconductor is disclosed as a compound semiconductor device.

FIGS. 1A to 2B are schematic cross-sectional views illustrating a method for producing an AlGaN/GaN HEMT according to a first embodiment in order of steps. An element isolation structure (not illustrated) is formed by the injection of argon (Ar) or the like into an element isolation region.

For example, a Si substrate is prepared as a substrate for growth. Examples of a substrate that may be used in place of the Si substrate include SiC substrates, sapphire substrates, and GaAs substrates. The substrate may be a semi-insulating substrate or a conductive substrate.

Figures 1A, 1B:
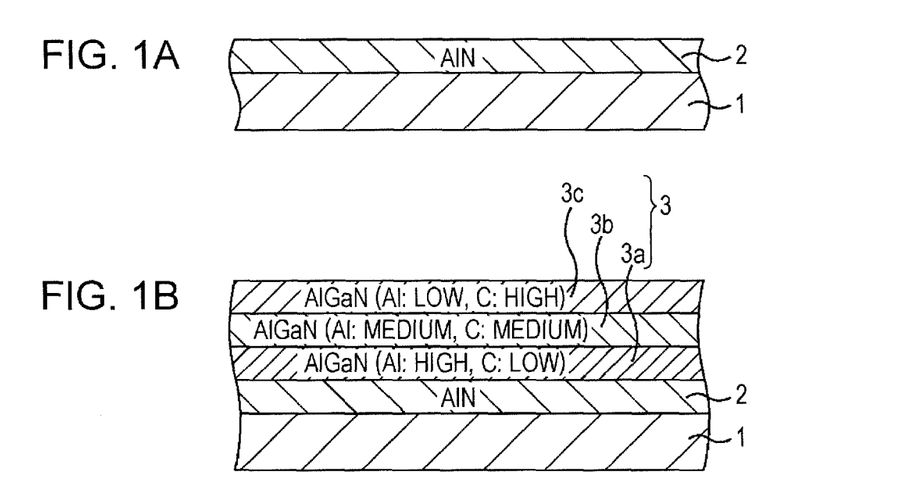
FIGS. 1A to 1D are schematic cross-sectional views illustrating a method for producing an AlGaN/GaN HEMT according to a first embodiment in order of steps.
Figure 1C:
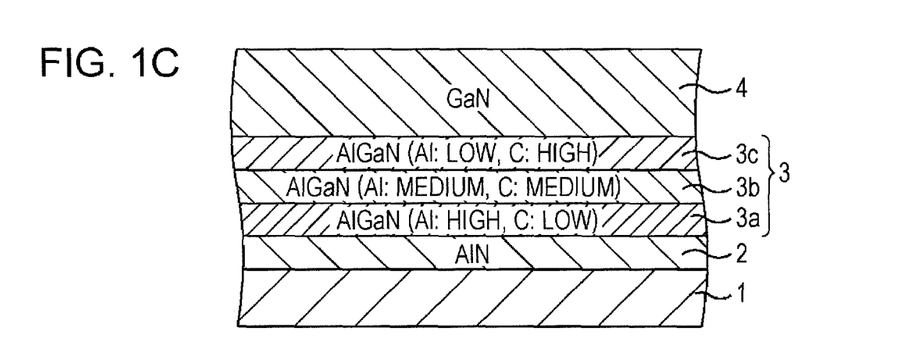
Figure 1D:
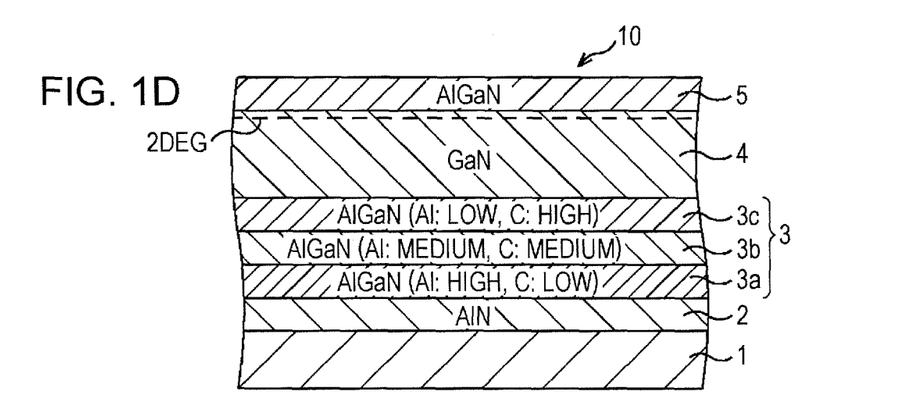

As illustrated in FIGS. 1A to 1D, compound semiconductors are sequentially grown on a Si substrate 1 by, for example, a metal organic vapor phase epitaxy (MOVPE) method to form a compound semiconductor multilayer structure 10 (FIG. 1D). The compound semiconductor multilayer structure 10 includes a first buffer layer 2, a second buffer layer 3, an electron transit layer 4, and an electron supply layer 5. These layers are sequentially stacked to form the compound semiconductor multilayer structure 10. Instead of the MOVPE method, a molecular beam epitaxy (MBE) method or the like may be used.

As illustrated in FIG. 1A, the first buffer layer 2 is formed on the Si substrate 1.

Specifically, AlN is grown as an initial layer on the Si substrate 1 having an upper surface of the (111) plane so as to have a thickness of about 200 nm. With respect to the growth conditions of AlN, a gas mixture of trimethylaluminum (TMA) gas and ammonia ($NH_3$) gas is used as a raw-material gas. The growth conditions include a V/III ratio (a ratio of the $NH_3$ gas to TMA gas) in the raw-material gas of about 1000 to about 2000, a growth temperature of about 1000° C., and a growth pressure of about 5 kPa. Thereby, the first buffer layer 2 is formed on the Si substrate 1. The first buffer layer 2 contains a small amount of carbon (C) as described below because the raw-material gas contains TMA gas. A higher V/III ratio results in a lower C concentration. The first buffer layer 2 has a C concentration of, for example, about $5 \times 10^{17}/cm^3$.

As illustrated in FIG. 1B, the second buffer layer 3 is formed on the first buffer layer 2. The second buffer layer 3 is formed so as to have a multilayer structure including, for example, three AlGaN sublayers 3a, 3b, and 3c.

Specifically, AlGaN is grown in such a manner that the Al composition decreases with increasing distance from its lower surface toward its upper surface and that the carbon (C) concentration increases with increasing distance from the lower surface toward the upper surface. Here, $Al_xGa_{1-x}N$, $Al_yGa_{1-y}N$, and $Al_zGa_{1-z}N$ are sequentially grown in such a manner that $0<z<y<x<1$ is satisfied and that the C concentration increases in that order, provided that the C concentration in $Al_xGa_{1-x}N$ is significantly higher than that in the first buffer layer 2.

A gas mixture of TMA gas, trimethylgallium (TMG) gas, and $NH_3$ gas is used as a raw-material gas for AlGaN. The flow ratio of TMA gas to TMG gas is adjusted to control the Al composition in AlGaN. A higher flow ratio of TMG gas to TMA gas results in a lower Al composition. The V/III ratio (the ratio of $NH_3$ gas to TMA gas and TMG gas) in the raw-material gas is adjusted to control the C concentration in AlGaN. TMA gas and TMG gas have methyl groups. Thus, the C concentration is adjusted by controlling the V/III ratio (carbon autodoping) without the doping of carbon (C) on purpose. A lower V/III ratio results in a higher C concentration in AlGaN. The C concentration may be controlled by adjusting the growth temperature or growth pressure. A lower growth temperature or a lower growth pressure results in a higher C concentration in AlGaN.

In this embodiment, the Al compositions and the C concentrations of $Al_xGa_{1-x}N$, $Al_yGa_{1-y}N$, and $Al_zGa_{1-z}N$ are adjusted as described below. The growth conditions include a V/III ratio of about 100 to about 600, a growth temperature of about 1000° C., and a growth pressure of about 5 kPa.

$Al_xGa_{1-x}N$ is grown so as to have a thickness of about 200 nm, an Al composition x of about $0.8 \leq x \leq$ about 0.9 (for example, x=about 0.9), and a C concentration of about $5 \times 10^{17}/cm^3$ to about $3 \times 10^{18}/cm^3$ (for example, about $1 \times 10^{18}/cm^3$).

$Al_yGa_{1-y}N$ is grown so as to have a thickness of about 200 nm, an Al composition y of about $0.6 \leq y \leq$ about 0.7 (for example, y=about 0.6), and a C concentration of about $3 \times 10^{18}/cm^3$ to about $6 \times 10^{18}/cm^3$ (for example, about $5 \times 10^{18}/cm^3$).

$Al_zGa_{1-z}N$ is grown so as to have a thickness of about 200 nm, an Al composition z of about $0.2 \leq z \leq$ about 0.3 (for example, z=about 0.2), and a C concentration of about $6 \times 10^{18}/cm^3$ to about $2 \times 10^{19}/cm^3$ (for example, about $1 \times 10^{19}/cm^3$).

As described above, $Al_xGa_{1-x}N$, $Al_yGa_{1-y}N$, and $Al_zGa_{1-z}N$ are sequentially grown. Thereby, the second buffer layer 3 in which the AlGaN sublayers 3a, 3b, and 3c are stacked is formed on the first buffer layer 2.

As illustrated in FIG. 1C, the electron transit layer 4 is formed on the second buffer layer 3. The electron transit layer 4 includes a lower layer region 4a and an upper layer region 4b.

Specifically, GaN is grown in such a manner that the lower layer region 4a has a high carbon (C) concentration and a higher C concentration than the AlGaN sublayer 3c and that the upper layer region 4b has a very low C concentration and a lower C concentration than the first buffer layer 2.

A gas mixture of TMG gas and $NH_3$ gas is used as a raw-material gas for GaN. The V/III ratio (the ratio of $NH_3$ gas to TMG gas) in the raw-material gas is adjusted to control the C concentration in the lower layer region of GaN. TMG gas has methyl groups. Thus, the C concentration is adjusted by controlling the V/III ratio (carbon autodoping) without the doping of carbon (C) on purpose. A lower V/III ratio results in a higher C concentration in GaN. The C concentration may be controlled by adjusting the growth temperature or growth pressure. A lower growth temperature or a lower growth pressure results in a higher C concentration in GaN.

In this embodiment, the lower layer region 4a of GaN is grown so as to have a thickness of about 200 nm. The growth conditions include a V/III ratio of about 30 to about 100, a growth temperature of about 1000° C., and a growth pressure of about 10 kPa in order to form the lower layer region 4a having a higher C concentration than the AlGaN sublayer 3c. The lower layer region 4a has a C concentration of about $2 \times 10^{17}/cm^3$ to about $1 \times 10^{20}/cm^3$ (for example, about $5 \times 10^{19}/cm^3$).

Subsequently, the upper layer region 4b of GaN is grown so as to have a thickness of about 1000 nm. The growth conditions include a V/III ratio of about 3000 to about 8000, a growth temperature of about 1000° C., a growth pressure of about 20 kPa in order to form the upper layer region 4b having a lower C concentration than the first buffer layer 2. The upper layer region 4b has a C concentration of about $1 \times 10^{16}/cm^3$ to about $1 \times 10^{17}/cm^3$ (for example, about $2 \times 10^{16}/cm^3$).

GaN is grown as described above to form the electron transit layer 4 composed of GaN on the second buffer layer 3, the electron transit layer 4 including the lower layer region 4a and the upper layer region 4b.

As illustrated in FIG. 1D, the electron supply layer 5 is formed on the electron transit layer 4.

Specifically, AlGaN is grown on the electron transit layer 4 so as to have a thickness of about 20 nm. With respect to the growth conditions of AlGaN, a gas mixture of TMA gas, TMG gas, and $NH_3$ gas is used as a raw-material gas. The growth conditions include a V/III ratio (a ratio of $NH_3$ gas to TMA gas and TMG gas) in the raw-material gas of about 1000, a growth temperature of about 1000° C., and a growth pressure of about 10 kPa. Thereby, the electron supply layer 5 is formed on the electron transit layer 4.

In this way, the compound semiconductor multilayer structure 10 including the first buffer layer 2, the second buffer layer 3, the electron transit layer 4, and the electron supply layer 5 stacked in that order is formed.

In the compound semiconductor multilayer structure 10, a two-dimensional electron gas (2DEG) is generated in the vicinity of the boundary between the electron transit layer 4 and the electron supply layer 5. The 2DEG is generated by a difference in lattice constant between the compound semiconductor (GaN here) and the compound semiconductor of the electron supply layer 5 (AlGaN here).

Figure 2A:
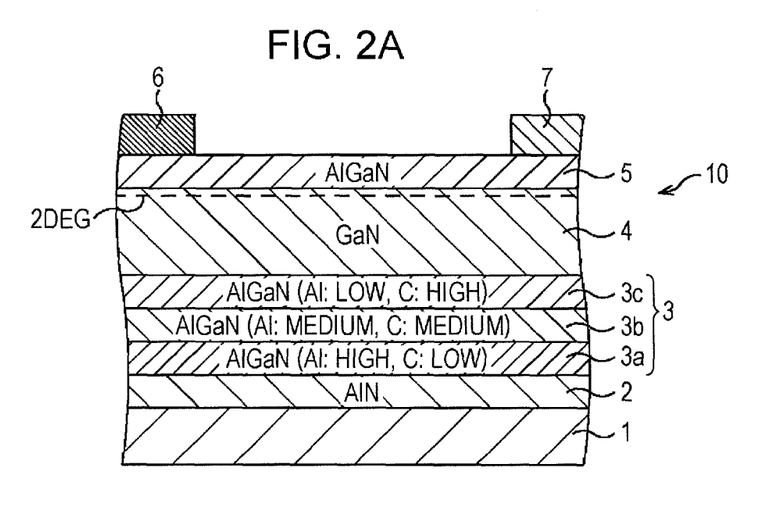
FIGS. 2A and 2B are schematic cross-sectional views illustrating the method for producing the AlGaN/GaN HEMT according to the first embodiment in order of steps subsequent to FIG. 1D.

Subsequently, as illustrated in FIG. 2A, a source electrode 6 and a drain electrode 7 are formed.

Specifically, a resist mask configured to form the source electrode and the drain electrode is formed. Here, a bilayer resist with an overhang structure, which is suitable for an evaporation method or a lift-off process, is used. The resist is applied on the electron supply layer 5. Openings configured to expose portions where the source electrode and the drain electrode will be formed are formed. In this way, the resist mask including the openings is formed.

Electrode materials, such as Ti/Al, are deposited by, for example, an evaporation method on the resist mask and the portions inside the openings. The thickness of Ti is about 100 nm. The thickness of Al is about 300 nm. The resist mask and Ti/Al deposited thereon are removed by a lift-off process. The Si substrate 1 is subjected to heat treatment in, for example, a nitrogen atmosphere at about 400° C. to about 1000° C., for example, about 600° C., to form an ohmic contact between remaining Ti/Al and the electron supply layer 5. When the ohmic contact between Ta/Al and the electron supply layer 5 is formed, the heat treatment may not be performed. In this way, the source electrode 6 and the drain electrode 7 are formed on the electron supply layer 5.

Figure 2B:
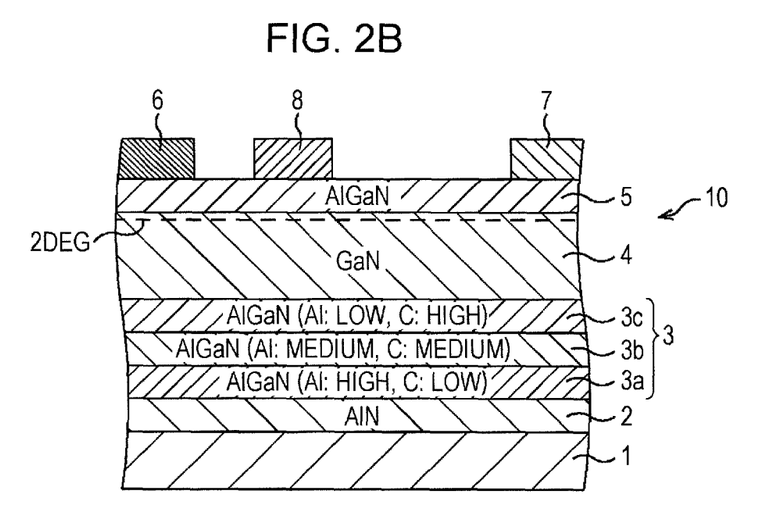

Next, as illustrated in FIG. 2B, a gate electrode 8 is formed.

Specifically, a resist mask configured to form the gate electrode is formed. Here, a bilayer resist with an overhang structure, which is suitable for an evaporation method or a lift-off process, is used. The resist is applied on the electron supply layer 5. An opening configured to expose a portion where the gate electrode will be formed is formed. In this way, the resist mask including the opening is formed.

Electrode materials, such as Ni/Au, are deposited by, for example, an evaporation method on the resist mask and the portion inside the opening. The thickness of Ni is about 50 nm. The thickness of Au is about 300 nm. The resist mask and the Ni/Au deposited thereon are removed by a lift-off process. Thereby, the gate electrode 8 that forms a Schottky contact with the electron supply layer 5 is formed at a predetermined position on the electron supply layer 5 and between the source electrode 6 and the drain electrode 7.

Then steps, such as a step of forming leads connected to the source electrode 6, the drain electrode 7, and the gate electrode 8 are performed to form the Schottky-type AlGaN/GaN HEMT according to this embodiment.

In this embodiment, the compound semiconductor multilayer structure 10 included in the AlGaN/GaN HEMT, a buffer between the Si substrate 1 and the electron transit layer 4 composed of GaN has a multilayer structure including the first buffer layer 2 composed of AlN and the second buffer layer 3 composed of AlGaN. The first buffer layer 2 serves to inhibit the reaction of Si with Ga between the Si substrate 1 and the second buffer layer 3 and buffer a difference in lattice constant between Si and AlGaN, for example.

Figure 3:
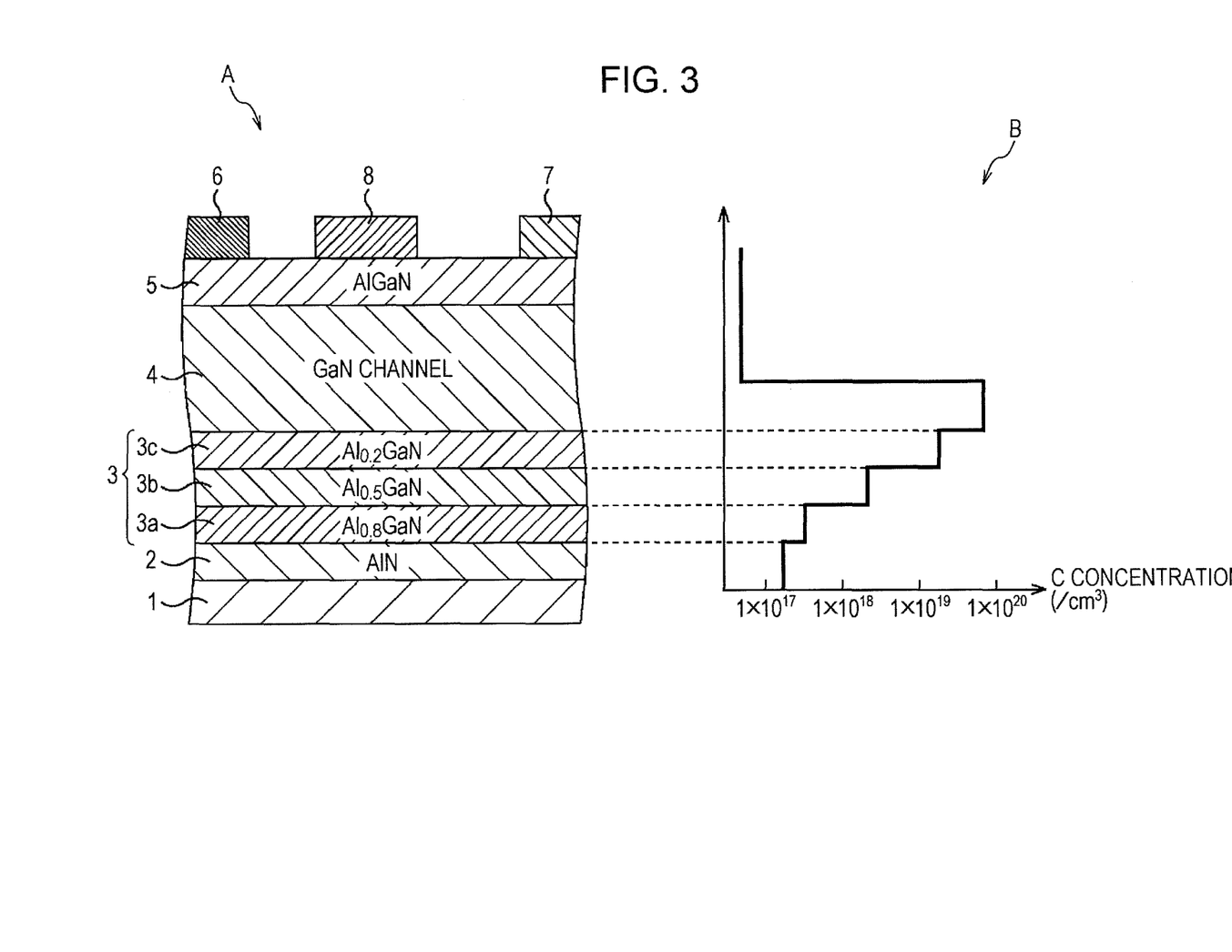
FIG. 3 is a characteristic diagram illustrating the C concentration distribution of layers in the AlGaN/GaN HEMT according to the first embodiment.

FIG. 3 is a characteristic diagram illustrating the C concentration distribution of the layers in the AlGaN/GaN HEMT according to this embodiment.

The first buffer layer 2 has a significantly low C concentration, for example, about $5 \times 10^{17}/cm^3$.

In the second buffer layer 3, the carbon concentration increases with increasing distance from the lower surface toward the upper surface. That is, the C concentration increases in the following order: the AlGaN sublayers 3a, 3b, and 3c. The AlGaN sublayers 3a, 3b, and 3c have C concentrations of, for example, about $1 \times 10^{18}/cm^3$, about $5 \times 10^{18}/cm^3$, and about $1 \times 10^{19}/cm^3$, respectively.

In the electron transit layer 4, the lower layer region 4a has a higher C concentration than the AlGaN sublayer 3c and a C concentration of, for example, about $5 \times 10^{19}/cm^3$. In contrast, the upper layer region 4b has a lower C concentration than the first buffer layer 2 and a C concentration of, for example, about $2 \times 10^{16}/cm^3$.

In the AlGaN/GaN HEMT, the second buffer layer 3 contains a relatively large amount of carbon (C) as a whole. The lower layer region 4a of the electron transit layer 4 has a significantly high C concentration. Carbon has the function of trapping electrons; hence, residual carrier concentrations in the second buffer layer 3 and the lower layer region 4a of the electron transit layer 4 are significantly reduced to inhibit the occurrence of an off-leakage current, thereby improving the breakdown voltage.

Here, in the case where the C concentrations in the AlGaN buffer layer and the lower layer region of the GaN electron transit layer are significantly increased, current collapse may be generated, and the crystallinity of the compound semiconductor multilayer structure including the electron transit layer and the electron supply layer may be reduced.

A higher C content (sheet concentration of C) of the compound semiconductor multilayer structure results in more frequent occurrence of current collapse. In this embodiment, the off-leakage current in the electron transit layer is generated in the lower layer region. Thus, the C concentration in the lower layer region 4a of the electron transit layer 4 is increased, and the C concentration in a region (upper layer region 4b) of the electron transit layer 4 other than the lower layer region 4a is minimized. This structure sufficiently inhibits the generation of the residual carrier concentration in the electron transit layer 4 and suppresses the total content of C in the electron transit layer 4, thereby inhibiting the occurrence of current collapse.

The crystallinity of the compound semiconductor multilayer structure decreases as the C content (sheet concentration of C) of the compound semiconductor multilayer structure increases. In this embodiment, with respect to the crystallinity of the compound semiconductor multilayer structure, it is found that for example, when the total C content is substantially fixed, a higher C concentration in an initially grown portion of the compound semiconductor multilayer structure, in other words, a higher C concentration in a lower layer portion of the compound semiconductor multilayer structure, results in a more adverse effect on the crystallinity.

Figure 4:
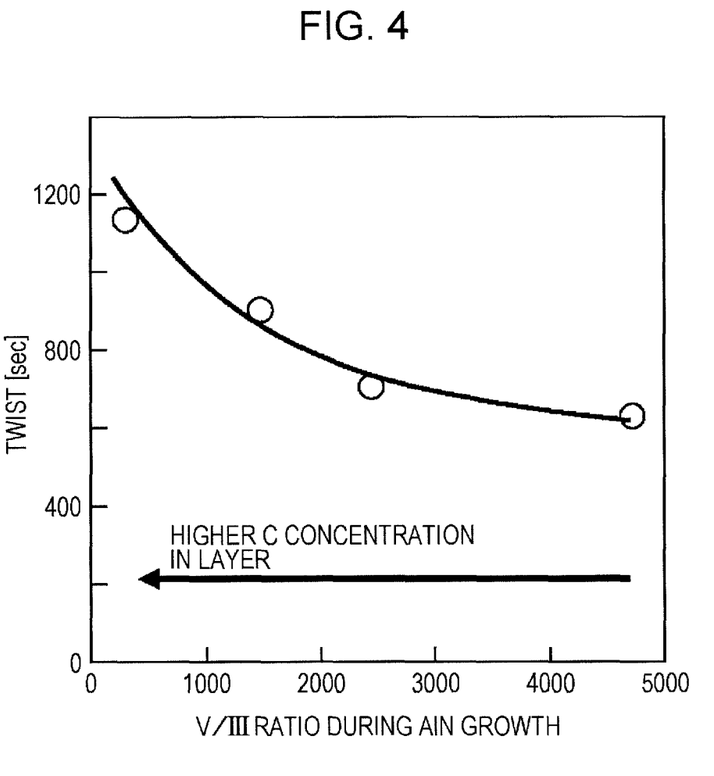
FIG. 4 is a characteristic diagram illustrating the relationship between the V/III ratio during the growth of AlN serving as a first buffer layer and the twist value of a compound semiconductor multilayer structure.

The effect of the initially grown layer, that is, the first buffer layer composed of AlN here, of the compound semiconductor multilayer structure on the crystallinity of the compound semiconductor multilayer structure is investigated. FIG. 4 is a characteristic diagram illustrating the relationship between the V/III ratio during the growth of AlN serving as the first buffer layer and the twist value of the compound semiconductor multilayer structure. A lower V/III ratio results in a higher C concentration in the layer. The twist value indicates the degree of the twist of the crystal and is used as an index to the degree of crystallinity. A lower twist value indicates better crystallinity. The twist of the crystal causes local fluctuations in potential and thus acts as a scattering factor for electrons, passing through the electron transit layer, in the 2DEG. Furthermore, the crystal twist forms a trap level, leading to the degradation of current collapse characteristics. In the device fabrication, it is desirable to achieve high crystallinity.

FIG. 4 demonstrates that a lower V/III ratio, that is, a higher C concentration in the first buffer layer serving as the initial layer, results in a higher twist value, degrading the crystallinity of the compound semiconductor multilayer structure. In the compound semiconductor multilayer structure, the crystallinity of a layer formed at an earlier stage of the growth of the structure is more adversely affected by carbon (C), which is an impurity. In the case where the buffer layers have a multilayer structure composed of AlN and AlGaN, let us consider AlGaN serving as the second buffer layer. As with AlN, a higher C concentration in a portion formed at an earlier stage of the growth of the compound semiconductor multilayer structure, that is, an initially grown portion (lower layer portion) of AlGaN, results in a higher twist value, degrading the crystallinity of the compound semiconductor multilayer structure.

Here, let us consider the case where the buffer layer is formed in such a manner that a high C concentration is achieved at the lower surface and that the C concentration decreases with increasing distance from a lower surface toward an upper surface, in order to reduce the total C content of the buffer layer. In this case, if the C concentration in the buffer layer is maintained at an appropriate level, it is possible to inhibit the occurrence of an off-leakage current. Unfortunately, when such a buffer layer is formed, an initially grown portion (lower layer portion) of the buffer layer has a high C concentration, thereby resulting in a compound semiconductor multilayer structure having a very low degree of crystallinity.

In this embodiment, the carbon (C) concentration in the second buffer layer 3 increases with increasing distance from the lower surface toward the upper surface. In other words, the AlGaN sublayer 3a, which is an initially grown portion (lower layer portion) of the second buffer layer 3, has a low C concentration. The AlGaN sublayer 3b has a higher C concentration than the AlGaN sublayer 3a. The AlGaN sublayer 3c has a higher C concentration than the AlGaN sublayer 3b. The lower layer region 4a of the electron transit layer 4 has a higher C concentration than the AlGaN sublayer 3c, which is the uppermost sublayer of the second buffer layer 3. The use of the structure significantly reduces the residual carrier concentrations in the second buffer layer 3 and the lower layer region 4a of the electron transit layer 4 while the excellent crystallinity of the compound semiconductor multilayer structure 10 is maintained, thus inhibiting the occurrence of an off-leakage current to improve the breakdown voltage. The first buffer layer 2 has a lower C concentration than the AlGaN sublayer 3a, which is the lowermost sublayer of the second buffer layer 3. This may ensure the excellent crystallinity of the compound semiconductor multilayer structure 10.

Furthermore, in this embodiment, the second buffer layer 3 is formed in such a manner that the Al compositions in the AlGaN sublayers 3a, 3b, and 3c constituting the second buffer layer 3 decrease in that order. The Al composition in the AlGaN buffer layer decreases with increasing distance from the lower surface toward the upper surface, thereby further improving the crystallinity of the compound semiconductor multilayer structure 10.

In this embodiment, the lower layer region 4a of the electron transit layer 4 has a high C concentration described above, whereas the other region (the upper layer region 4b) of the electron transit layer 4 has a very low C concentration (lower than the first buffer layer 2). In this case, the total C content of the compound semiconductor multilayer structure 10 is suppressed to a relatively low level owing to the C concentration distribution achieved in the second buffer layer 3. Furthermore, in the upper region of the electron transit layer 4, the C concentration is steeply suppressed to a low level. The use of this structure may inhibit the occurrence of current collapse.

As has been described above, this embodiment provides the highly reliable Schottky-type AlGaN/GaN HEMT which inhibits the occurrence of an off-leakage current and achieves a high breakdown voltage while the crystallinity of the compound semiconductor multilayer structure 10 is maintained at a satisfactory level and the occurrence of current collapse is inhibited.

Modification

A modification of the first embodiment will be described below. In this embodiment, the Schottky-type AlGaN/GaN HEMT is exemplified. In this modification, what is called a metal-insulator-semiconductor (MIS)-type AlGaN/GaN HEMT, which includes a gate electrode formed on a gate insulating film, is exemplified.

Figure 5A:
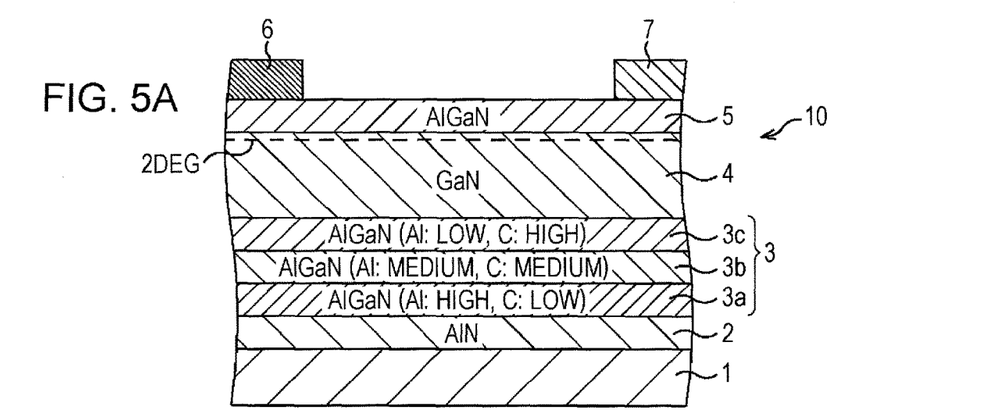
FIGS. 5A to 5C are schematic cross-sectional views illustrating main steps of a method for producing an AlGaN/GaN HEMT according to a modification of the first embodiment.
Figure 5B:
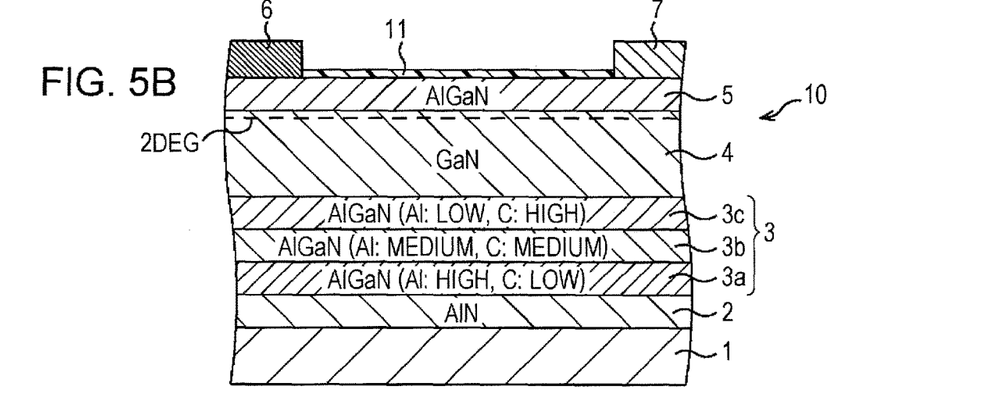
Figure 5C:
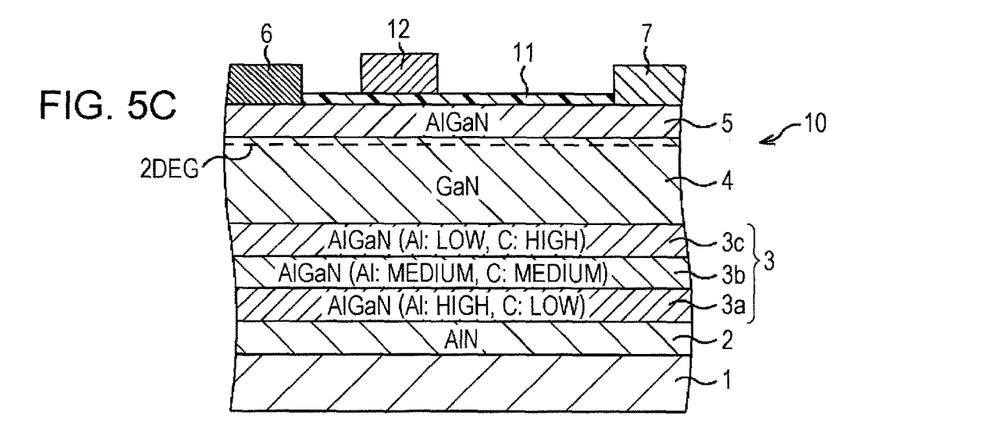

FIGS. 5A to 5C are schematic cross-sectional views illustrating main steps of a method for producing the AlGaN/GaN HEMT according to the modification of the first embodiment.

In this modification, as with the first embodiment, the steps illustrated in FIGS. 1A to 1D and 2A are performed. FIG. 5A illustrates a state in which the source electrode 6 and the drain electrode 7 are formed on the compound semiconductor multilayer structure 10.

Subsequently, as illustrated in FIG. 5B, a gate insulating film 11 is formed.

Specifically, for example, $Al_2O_3$ is deposited as an insulating material on the compound semiconductor multilayer structure 10. $Al_2O_3$ is deposited by, for example, an atomic layer deposition (ALD) method so as to have a thickness of about 2 nm to about 200 nm (about 10 nm here). Thereby, the gate insulating film 11 is formed.

The deposition of $Al_2O_3$ may be performed by, for example, a plasma-enhanced chemical vapor deposition (CVD) method or a sputtering method instead of the ALD method. A nitride of Al or an oxynitride of Al may be used instead of the deposition of $Al_2O_3$. Further examples of a material that may be used instead of $Al_2O_3$ include oxides, nitrides, and oxynitrides of Si, Hf, Zr, Ti, Ta, and W. For example, materials appropriately selected therefrom may be deposited to form a multilayer gate insulating film.

Subsequently, as illustrated in FIG. 5C, a gate electrode 12 is formed.

Specifically, a resist mask configured to form the gate electrode is formed. Here, a bilayer resist with an overhang structure, which is suitable for an evaporation method or a lift-off process, is used. The resist is applied on the gate insulating film 11. An opening configured to expose a portion where the gate electrode will be formed is formed. In this way, the resist mask including the opening is formed.

Electrode materials, such as Ni/Au, are deposited by, for example, an evaporation method on the resist mask and the portion inside the opening. The thickness of Ni is about 50 nm. The thickness of Au is about 300 nm. The resist mask and the Ni/Au deposited thereon are removed by a lift-off process. Thereby, the gate electrode 12 is formed at a predetermined position on the gate insulating film 11 and between the source electrode 6 and the drain electrode 7.

Then steps, such as a step of forming leads connected to the source electrode 6, the drain electrode 7, and the gate electrode 12 are performed to form the MIS-type AlGaN/GaN HEMT according to this modification.

This modification provides the highly reliable MIS-type AlGaN/GaN HEMT which inhibits the occurrence of an off-leakage current and achieves a high breakdown voltage while the crystallinity of the compound semiconductor multilayer structure 10 is maintained at a satisfactory level and the occurrence of current collapse is inhibited.

In this modification, the gate insulating film 11 may be formed only on a portion of a surface of the electron supply layer 5 located under the gate electrode 12. In this case, for example, silicon nitride is suitably deposited on other portions of the surface of the electron supply layer 5 (portions between the source electrode 6 and the gate electrode 8 and between the gate electrode 8 and the drain electrode 7) to form a passivation film.

Second Embodiment

In a second embodiment, as with the first embodiment, a Schottky-type AlGaN/GaN HEMT is disclosed. This Schottky-type AlGaN/GaN HEMT differs from that in the first embodiment in the structure of the second buffer layer.

FIGS. 6A to 7B are schematic cross-sectional views illustrating a method for producing the AlGaN/GaN HEMT according to the second embodiment in order of steps.

Figure 6A:
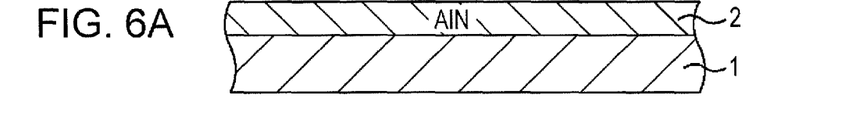
FIGS. 6A to 6D are schematic cross-sectional views illustrating a method for producing an AlGaN/GaN HEMT according to a second embodiment in order of steps.

In this embodiment, as with the first embodiment, the step illustrated in FIG. 1A is first performed. FIG. 6A illustrates a state in which the first buffer layer 2 is formed on the Si substrate 1.

Figure 6B:
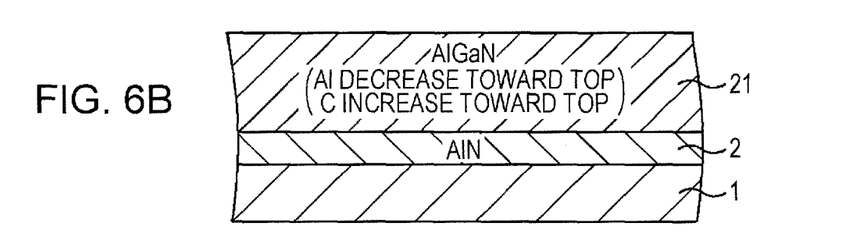

Subsequently, as illustrated in FIG. 6B, a second buffer layer 21 is formed on the first buffer layer 2.

Specifically, AlGaN is grown in such a manner that the Al composition decreases gradually with increasing distance from its lower surface toward its upper surface and that the carbon (C) concentration increases gradually with increasing distance from the lower surface toward the upper surface, provided that the C concentration at the lower surface of AlGaN is significantly higher than that in the first buffer layer 2.

A gas mixture of TMA gas, TMG gas, and $NH_3$ gas is used as a raw-material gas for AlGaN. The flow ratio of TMA gas to TMG gas is adjusted to control the Al composition in AlGaN. A higher flow ratio of TMG gas to TMA gas results in a lower Al composition. The V/III ratio (the ratio of $NH_3$ gas to TMA gas and TMG gas) in the raw-material gas is adjusted to control the C concentration in AlGaN. TMA gas and TMG gas have methyl groups. Thus, the C concentration is adjusted by controlling the V/III ratio (carbon autodoping) without the doping of carbon (C) on purpose. A lower V/III ratio results in a higher C concentration in AlGaN. The C concentration may be controlled by adjusting the growth temperature or growth pressure. A lower growth temperature or a lower growth pressure results in a higher C concentration in AlGaN.

In this embodiment, the Al composition and the C concentration of AlGaN are adjusted as described below. The growth conditions include a V/III ratio of about 100 to about 600, a growth temperature of about 1000° C., and a growth pressure of about 5 kPa.

At the lower surface, the Al composition of AlGaN is about 0.8 to about 0.9 (for example, about 0.9). At the upper surface, the Al composition of AlGaN is about 0.2 to about 0.3 (for example, about 0.2). The Al composition of AlGaN is adjusted so as to decrease gradually with increasing distance from the lower surface toward the upper surface.

At the lower surface, the C concentration in AlGaN is about $5 \times 10^{17}/cm^3$ to about $5 \times 10^{18}/cm^3$ (for example, about $5 \times 10^{18}/cm^3$). At the upper surface, the C concentration in AlGaN is about $5 \times 10^{18}/cm^3$ to about $1 \times 10^{20}/cm^3$ (for example, about $1 \times 10^{19}/cm^3$). The C concentration in AlGaN is adjusted so as to increase gradually with increasing distance from the lower surface toward the upper surface.

As described above, the second buffer layer 21 composed of AlGaN whose Al composition (decreases toward the top) and C concentration (increases toward the top) are adjusted is formed on the first buffer layer 2.

Figure 6C:
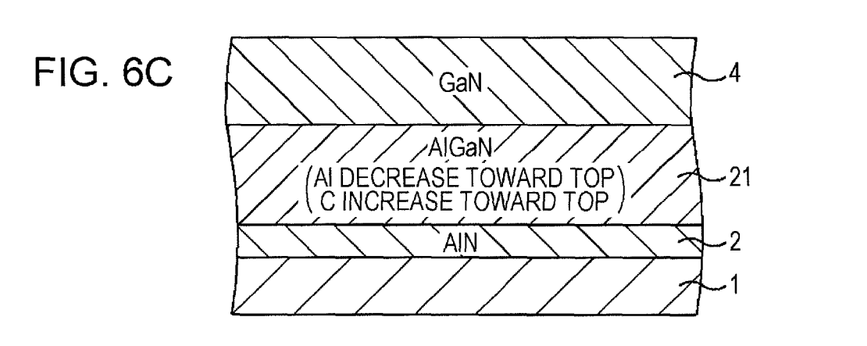

Subsequently, as illustrated in FIG. 6C, the electron transit layer 4 is formed on the second buffer layer 21. The electron transit layer 4 includes the lower layer region 4a and the upper layer region 4b.

Specifically, GaN is grown in such a manner that the lower layer region has a high carbon (C) concentration and a higher C concentration than the upper surface of the second buffer layer 21 and that the upper layer region has a very low C concentration and a lower C concentration than the first buffer layer 2.

A gas mixture of TMG gas and $NH_3$ gas is used as a raw-material gas for GaN. The V/III ratio (the ratio of $NH_3$ gas to TMG gas) in the raw-material gas is adjusted to control the C concentration in the lower layer region of GaN. TMG gas has methyl groups. Thus, the C concentration is adjusted by controlling the V/III ratio (carbon autodoping) without the doping of carbon (C) on purpose. A lower V/III ratio results in a higher C concentration in GaN. The C concentration may be controlled by adjusting the growth temperature or growth pressure. A lower growth temperature or a lower growth pressure results in a higher C concentration in GaN.

In this embodiment, the lower layer region 4a of GaN is grown so as to have a thickness of about 200 nm. The growth conditions include a V/III ratio of about 30 to about 100, a growth temperature of about 1000° C., and a growth pressure of about 10 kPa in order to form the lower layer region 4a having a higher C concentration than the upper surface of the second buffer layer 21. The lower layer region 4a has a C concentration of about $1 \times 10^{19}/cm^3$ to about $1 \times 10^{20}/cm^3$ (for example, about $5 \times 10^{19}/cm^3$).

Subsequently, the upper layer region 4b of GaN is grown so as to have a thickness of about 1000 nm. The growth conditions include a V/III ratio of about 3000 to about 8000, a growth temperature of about 1000° C., a growth pressure of about 20 kPa in order to form the upper layer region 4b having a lower C concentration than the first buffer layer 2.

The upper layer region 4b has a C concentration of about $1\times10^{16}$/cm$^3$ to about $1\times10^{17}$/cm$^3$ (for example, about $2\times10^{16}$/cm$^3$).

GaN is grown as described above to form the electron transit layer 4 composed of GaN on the second buffer layer 21, the electron transit layer 4 including the lower layer region 4a and the upper layer region 4b.

Figure 6D:
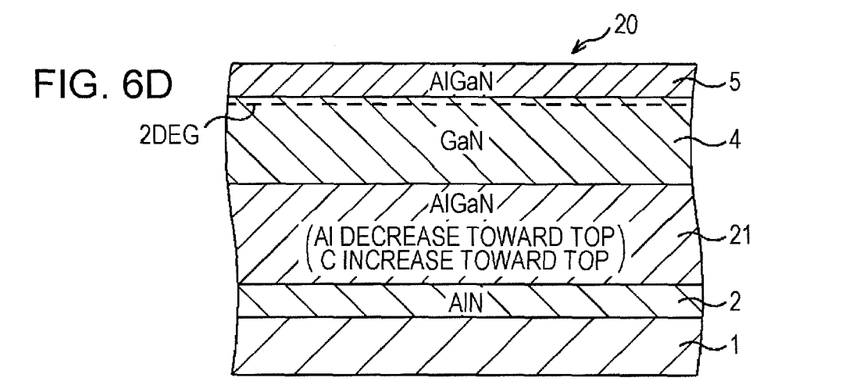

As illustrated in FIG. 6D, the electron supply layer 5 is formed on the electron transit layer 4.

Specifically, AlGaN is grown on the electron transit layer 4 so as to have a thickness of about 20 nm. With respect to the growth conditions of AlGaN, a gas mixture of TMA gas, TMG gas, and NH$_3$ gas is used as a raw-material gas. The growth conditions include a V/III ratio (a ratio of NH$_3$ gas to TMA gas and TMG gas) in the raw-material gas of about 1000, a growth temperature of about 1000° C., and a growth pressure of about 10 kPa. Thereby, the electron supply layer 5 is formed on the electron transit layer 4.

In this way, a compound semiconductor multilayer structure 20 including the first buffer layer 2, the second buffer layer 21, the electron transit layer 4, and the electron supply layer 5 stacked in that order is formed.

In the compound semiconductor multilayer structure 20, a two-dimensional electron gas (2DEG) is generated in the vicinity of the boundary between the electron transit layer 4 and the electron supply layer 5. The 2DEG is generated by a difference in lattice constant between the compound semiconductor (GaN here) and the compound semiconductor of the electron supply layer 5 (AlGaN here).

Figure 7A:
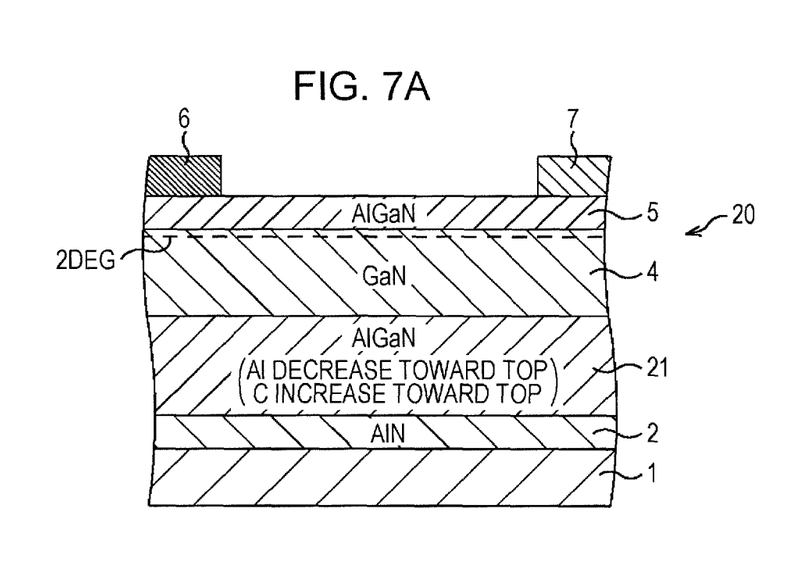
FIGS. 7A and 7B are schematic cross-sectional views illustrating the method for producing the AlGaN/GaN HEMT according to the second embodiment in order of steps subsequent to FIG. 6D.

Subsequently, as illustrated in FIG. 7A, the source electrode 6 and the drain electrode 7 are formed.

Specifically, a resist mask configured to form the source electrode and the drain electrode is formed. Here, a bilayer resist with an overhang structure, which is suitable for an evaporation method or a lift-off process, is used. The resist is applied on the electron supply layer 5. Openings configured to expose portions where the source electrode and the drain electrode will be formed are formed. In this way, the resist mask including the openings is formed.

Electrode materials, such as Ti/Al, are deposited by, for example, an evaporation method on the resist mask and the portions inside the openings. The thickness of Ti is about 100 nm. The thickness of Al is about 300 nm. The resist mask and Ti/Al deposited thereon are removed by a lift-off process. The Si substrate 1 is subjected to heat treatment in, for example, a nitrogen atmosphere at about 400° C. to about 1000° C., for example, about 600° C., to form an ohmic contact between remaining Ti/Al and the electron supply layer 5. When the ohmic contact between Ta/Al and the electron supply layer 5 is formed, the heat treatment may not be performed. In this way, the source electrode 6 and the drain electrode 7 are formed on the electron supply layer 5.

Figure 7B:
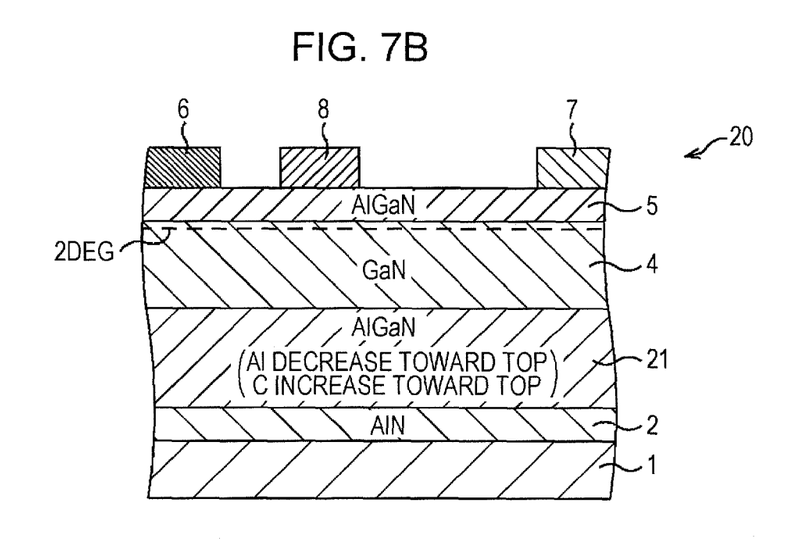

Next, as illustrated in FIG. 7B, the gate electrode 8 is formed.

Specifically, a resist mask configured to form the gate electrode is formed. Here, a bilayer resist with an overhang structure, which is suitable for an evaporation method or a lift-off process, is used. The resist is applied on the electron supply layer 5. An opening configured to expose a portion where the gate electrode will be formed is formed. In this way, the resist mask including the opening is formed.

Electrode materials, such as Ni/Au, are deposited by, for example, an evaporation method on the resist mask and the portion inside the opening. The thickness of Ni is about 50 nm. The thickness of Au is about 300 nm. The resist mask and the Ni/Au deposited thereon are removed by a lift-off process. Thereby, the gate electrode 8 that forms a Schottky contact with the electron supply layer 5 is formed at a predetermined position on the electron supply layer 5 and between the source electrode 6 and the drain electrode 7.

Then steps, such as a step of forming leads connected to the source electrode 6, the drain electrode 7, and the gate electrode 8 are performed to form the Schottky-type AlGaN/GaN HEMT according to this embodiment.

In the AlGaN/GaN HEMT according to this embodiment, the second buffer layer 21 contains a relatively large amount of carbon (C) as a whole. The lower layer region 4a of the electron transit layer 4 has a significantly high C concentration. Carbon has the function of trapping electrons; hence, residual carrier concentrations in the second buffer layer 21 and the lower layer region 4a of the electron transit layer 4 are significantly reduced to inhibit the occurrence of an off-leakage current, thereby improving the breakdown voltage.

A higher C content (sheet concentration of C) of the compound semiconductor multilayer structure results in more frequent occurrence of current collapse. In this embodiment, the off-leakage current in the electron transit layer is generated in the lower layer region. Thus, the C concentration in the lower layer region 4a of the electron transit layer 4 is increased, and the C concentration in a region (upper layer region 4b) of the electron transit layer 4 other than the lower layer region 4a is minimized. This structure sufficiently inhibits the generation of the residual carrier concentration in the electron transit layer 4 and suppresses the total content of C in the electron transit layer 4, thereby inhibiting the occurrence of current collapse.

The crystallinity of the compound semiconductor multilayer structure decreases as the C content (sheet concentration of C) of the compound semiconductor multilayer structure increases. In this embodiment, with respect to the crystallinity of the compound semiconductor multilayer structure, for example, when the total C content is fixed, a higher C concentration in an initially grown portion of the compound semiconductor multilayer structure, in other words, a higher C concentration in a lower layer portion of the compound semiconductor multilayer structure, results in a more adverse effect on the crystallinity.

In this embodiment, in the second buffer layer 21, the C concentration increases gradually with increasing distance from the lower surface toward the upper surface. The lower layer region 4a of the electron transit layer 4 has a higher C concentration than the upper surface of the second buffer layer 21. The use of the structure reduces the residual carrier concentrations in the second buffer layer 21 and the lower layer region 4a of the electron transit layer 4 while the excellent crystallinity of the compound semiconductor multilayer structure 20 is maintained, thus inhibiting the occurrence of an off-leakage current to improve the breakdown voltage. The first buffer layer 2 has a lower C concentration than the lower surface of the second buffer layer 21. This may ensure the excellent crystallinity of the compound semiconductor multilayer structure 20.

Furthermore, in this embodiment, the second buffer layer 21 is formed in such a manner that the Al composition decreases gradually with increasing distance from the lower surface toward the upper surface. The Al composition in the AlGaN buffer layer decreases with increasing distance from the lower surface toward the upper surface, thereby further improving the crystallinity of the compound semiconductor multilayer structure 20.

In this embodiment, the lower layer region 4a of the electron transit layer 4 has a high C concentration described above, whereas the other region (the upper layer region 4b)

of the electron transit layer 4 has a very low C concentration (lower than the first buffer layer 2). In this case, the total C content of the compound semiconductor multilayer structure 20 is suppressed to a relatively low level owing to the C concentration distribution achieved in the second buffer layer 21. Furthermore, in the upper region of the electron transit layer 4, the C concentration is steeply suppressed to a low level. The use of this structure may inhibit the occurrence of current collapse.

As has been described above, this embodiment provides the highly reliable Schottky-type AlGaN/GaN HEMT which inhibits the occurrence of an off-leakage current and achieves a high breakdown voltage while the crystallinity of the compound semiconductor multilayer structure 20 is maintained at a satisfactory level and the occurrence of current collapse is inhibited.

In this embodiment, as with the modification of the first embodiment, a gate insulating film may be formed between the compound semiconductor multilayer structure 20 and the gate electrode 8 to form a MIS-type AlGaN/GaN HEMT.

Third Embodiment

In a third embodiment, a power-supply unit including one selected from AlGaN/GaN HEMTs according to the first embodiment, the modification of the first embodiment, and the second embodiment is disclosed.

Figure 8:
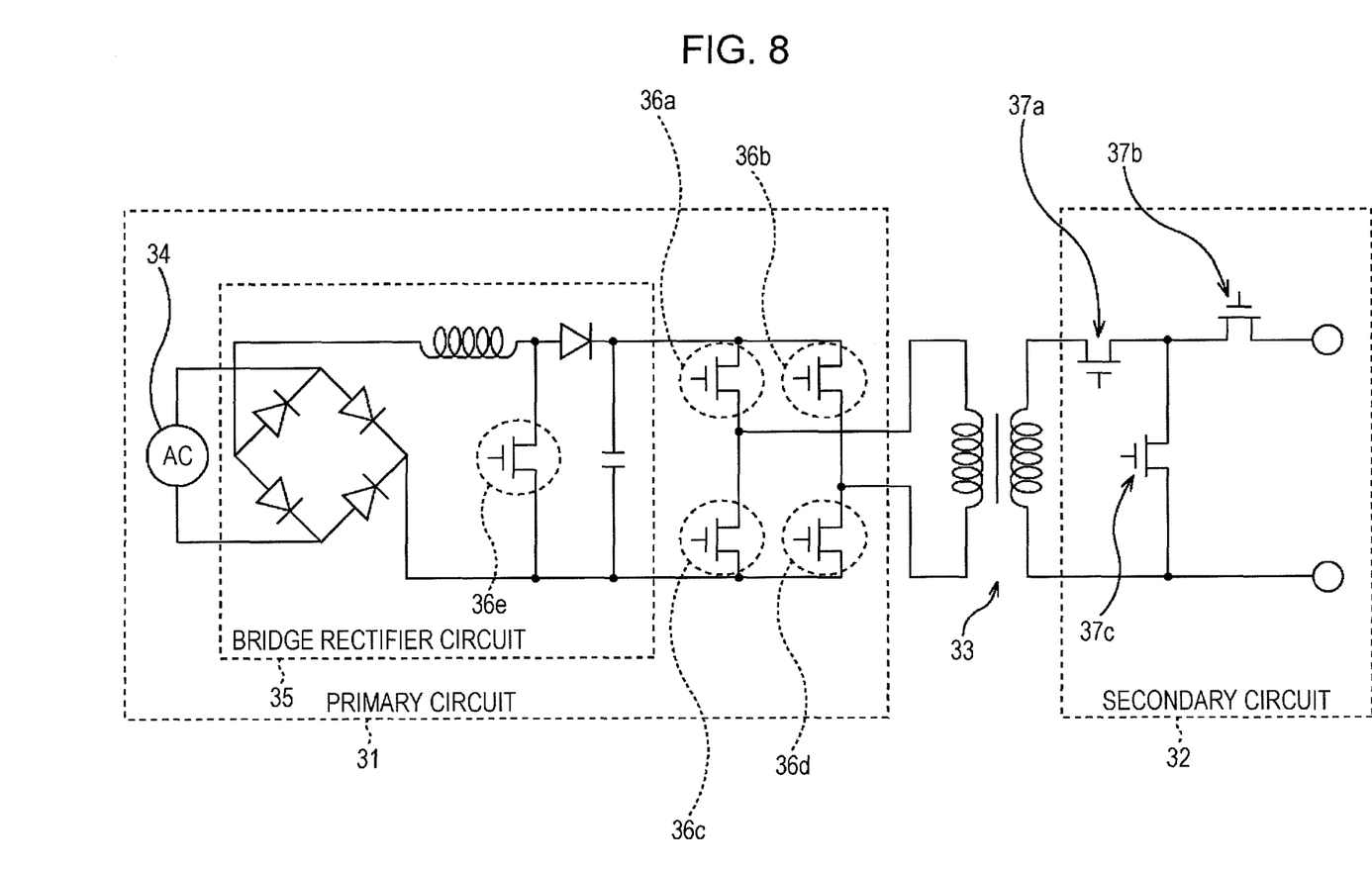
FIG. 8 is a connection diagram illustrating a schematic structure of a power-supply unit according to a third embodiment.

FIG. 8 is a connection diagram illustrating a schematic structure of the power-supply unit according to the third embodiment.

The power-supply unit according to this embodiment includes a high-voltage primary circuit 31, a low-voltage secondary circuit 32, and a transformer 33 arranged between the primary circuit 31 and the secondary circuit 32.

The primary circuit 31 includes an alternating-current power supply 34, what is called a bridge rectifier circuit 35, and a plurality of, for example, four switching elements 36a, 36b, 36c, and 36d. The bridge rectifier circuit 35 includes a switching element 36e.

The secondary circuit 32 includes a plurality of, for example, three switching elements 37a, 37b, and 37c.

In this embodiment, each of the switching elements 36a, 36b, 36c, 36d, and 36e of the primary circuit 31 is one selected from AlGaN/GaN HEMTs according to the first embodiment, the modification of the first embodiment, and the second embodiment. Each of the switching elements 37a, 37b, and 37c of the secondary circuit 32 is a common MIS FET including silicon.

In this embodiment, the high-voltage circuit includes the highly reliable AlGaN/GaN HEMTs each inhibiting the occurrence of an off-leakage current and achieving a high breakdown voltage while the crystallinity of the compound semiconductor multilayer structure is maintained at a satisfactory level and the occurrence of current collapse is inhibited. Thereby, a highly reliable, high-power power supply unit is made.

Fourth Embodiment

In a fourth embodiment, a high-frequency amplifier including one selected from AlGaN/GaN HEMTs according to the first embodiment, the modification of the first embodiment, and the second embodiment is disclosed.

Figure 9:
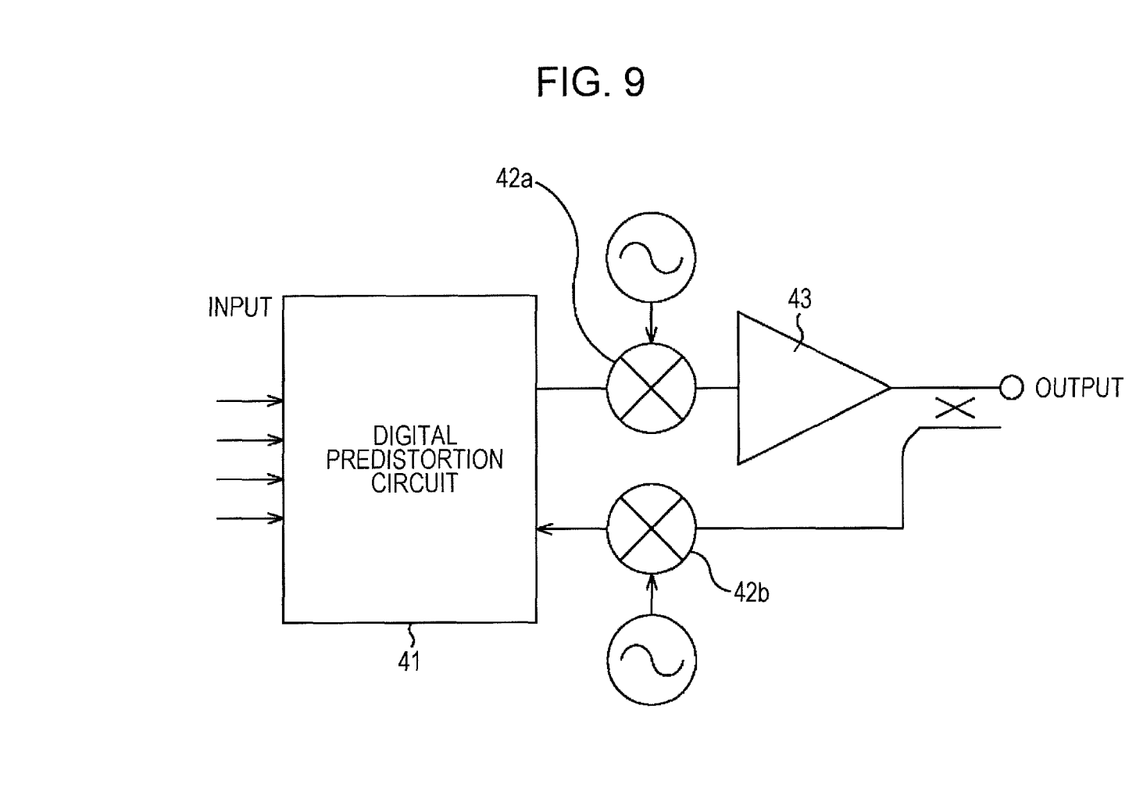
FIG. 9 is a connection diagram illustrating a schematic structure of a high-frequency amplifier according to a fourth embodiment.

FIG. 9 is a connection diagram illustrating a schematic structure of the high-frequency amplifier according to the fourth embodiment.

The high-frequency amplifier according to this embodiment includes a digital predistortion circuit 41, mixers 42a and 42b, and a power amplifier unit 43.

The digital predistortion circuit 41 compensates the nonlinear distortion of an input signal. The mixer 42a mixes an alternating current signal with the input signal whose nonlinear distortion has been compensated. The power amplifier unit 43 amplifies the input signal mixed with the alternating current signal. The power amplifier unit 43 includes one selected from AlGaN/GaN HEMTs according to the first embodiment, the modification of the first embodiment, and the second embodiment. In FIG. 9, for example, on the basis of switching of the switch, an output signal can be mixed with the alternating current signal by the mixer 42b, and the mixed signal is fed to the primary circuit 31.

In this embodiment, the high-frequency amplifier includes the highly reliable AlGaN/GaN HEMT which inhibits the occurrence of an off-leakage current and which achieves a high breakdown voltage while the crystallinity of the compound semiconductor multilayer structure is maintained at a satisfactory level and the occurrence of current collapse is inhibited. Thereby, the highly reliable high-frequency amplifier with high breakdown voltage is made.

Other Embodiments

In the first to fourth embodiments and the modification of the first embodiment, the AlGaN/GaN HEMTs have been exemplified as compound semiconductor devices. The following HEMTs in addition to the AlGaN/GaN HEMTs may be used for compound semiconductor devices.

Example 1: Other HEMTs

In this example, InAlN/GaN HEMTs are disclosed as compound semiconductor devices.

InAlN and GaN are compound semiconductors whose lattice constants may be brought close to each other by adjusting their compositions. In this case, in the first to fourth embodiments and the modification of the first embodiment described above, the first buffer layers are composed of AlN, the second buffer layers are composed of AlGaN, the electron transit layers are composed of GaN, and the electron supply layers are composed of InAlN. In this case, substantially no piezoelectric polarization occurs. Thus, two-dimensional electron gases are mainly generated by the spontaneous polarization of InAlN.

As with the foregoing AlGaN/GaN HEMTs, this example provides the highly reliable InAlN/GaN HEMTs each inhibiting the occurrence of an off-leakage current and achieving a high breakdown voltage while the crystallinity of the compound semiconductor multilayer structure is maintained at a satisfactory level and the occurrence of current collapse is inhibited.

Example 2: Other HEMTs

In this example, InAlGaN/GaN HEMTs are disclosed as compound semiconductor devices.

GaN and InAlGaN are compound semiconductors. InAlGaN may have a smaller lattice constant than GaN by adjusting their compositions. In this case, in the first to fourth embodiments and the modification of the first embodiment described above, the first buffer layers are composed of AlN, the second buffer layers are composed of AlGaN, the electron transit layers are composed of GaN, and the electron supply layers are composed of InAlGaN.

As with the foregoing AlGaN/GaN HEMTs, this example provides the highly reliable InAlGaN/GaN HEMTs each inhibiting the occurrence of an off-leakage current and achieving a high breakdown voltage while the crystallinity of the compound semiconductor multilayer structure is maintained at a satisfactory level and the occurrence of current collapse is inhibited.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device comprising:
a compound semiconductor multilayer structure including a first buffer layer composed of AlN and formed on a substrate, wherein the first buffer layer contains carbon;
a second buffer layer composed of AlGaN and formed over the first buffer layer, wherein the second buffer layer contains carbon; and
an electron transit layer formed over the second buffer layer, wherein the electron transit layer includes a lower layer region and a higher layer region that is formed over the lower layer region,
wherein a concentration of carbon of the second buffer layer increases with increasing distance from a lower surface toward an upper surface of the second buffer layer,
wherein the second buffer layer has a first sublayer over the first buffer layer having a first concentration of carbon, and has a second sublayer over the first sublayer having a second concentration of carbon higher than the first concentration of carbon,
wherein the lower layer region of the electron transit layer contains carbon and has a third concentration of carbon higher than the second concentration of carbon, and
wherein the higher layer region of the electron transit layer contains carbon and has a fourth concentration of carbon lower than a concentration of carbon of the first buffer layer.

2. The compound semiconductor device according to claim 1,
wherein an Al composition of the second buffer layer decreases with increasing distance from the lower surface toward the upper surface.

3. The compound semiconductor device according to claim 1,
wherein the first buffer layer has a lower concentration of carbon than the lower surface of the second buffer layer.

4. The compound semiconductor device according to claim 1,
wherein the second buffer layer has three sublayers, and
wherein the concentration of carbon in the second buffer layer increases with increasing distance from the lower surface toward the upper surface.

5. The compound semiconductor device according to claim 1,
wherein the concentration of carbon in the second buffer layer increases gradually with increasing distance from the lower surface toward the upper surface.

6. The compound semiconductor device according to claim 1,
wherein the first buffer layer has a concentration of carbon lower than the first sublayer of the second buffer layer.

7. A method for producing a compound semiconductor device, comprising:
forming a first buffer layer composed of AlN including carbon over a substrate;
forming a second buffer layer composed of AlGaN over the first buffer layer so that an upper surface of the second buffer layer includes carbon more than a lower surface of the second buffer layer;
forming a lower layer region of an electron transit layer over the second buffer layer so that the lower layer region includes carbon more than the upper surface of the second buffer layer, and
forming a higher layer region of the electron transit layer over the lower layer region so that the higher layer region includes carbon less than the first buffer layer.

8. The method according to claim 7,
wherein an Al composition of the second buffer layer decreases with increasing distance from the lower surface toward the upper surface.

9. The method according to claim 7,
wherein the first buffer layer has a lower concentration of carbon than the lower surface of the second buffer layer.

10. The method according to claim 7,
wherein the second buffer layer has three sublayers, and
wherein the concentration of carbon in the second buffer layer increases with increasing distance from the lower surface toward the upper surface.

11. The method according to claim 7,
wherein the concentration of carbon in the second buffer layer increases gradually with increasing distance from the lower surface toward the upper surface.

* * * * *